(12) United States Patent
Kang

(10) Patent No.: US 9,097,930 B2
(45) Date of Patent: Aug. 4, 2015

(54) FLAT PANEL DISPLAY

(71) Applicant: SAMSUNG DISPLAY CO., LTD., Yongin, Gyeonggi-Do (KR)

(72) Inventor: Go-Woon Kang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 50 days.

(21) Appl. No.: 14/027,273

(22) Filed: Sep. 16, 2013

(65) Prior Publication Data

US 2014/0293573 A1    Oct. 2, 2014

(30) Foreign Application Priority Data

Mar. 27, 2013    (KR) .................. 10-2013-0033063

(51) Int. Cl.
*F21V 9/14*     (2006.01)
*H05K 7/02*     (2006.01)
*G02F 1/1335*   (2006.01)

(52) U.S. Cl.
CPC ............... *G02F 1/1335* (2013.01); *F21V 9/14* (2013.01); *H05K 7/02* (2013.01)

(58) Field of Classification Search
None
See application file for complete search history.

(56) References Cited

U.S. PATENT DOCUMENTS

| 2009/0278151 A1* | 11/2009 | Kim ................................. 257/98 |
| 2013/0002572 A1* | 1/2013 | Jin et al. ........................ 345/173 |
| 2013/0003396 A1* | 1/2013 | Sakata et al. .................. 362/509 |

FOREIGN PATENT DOCUMENTS

| KR | 10-2006-0064162 A | 6/2006 |
| KR | 10-2009-0008569 A | 1/2009 |
| KR | 10-2009-0033427 A | 4/2009 |

* cited by examiner

*Primary Examiner* — Ashok Patel
(74) *Attorney, Agent, or Firm* — Lee & Morse, P.C.

(57) ABSTRACT

A flat panel display including a flat display device; and a window protecting the flat display device, the window transmitting light emitted from the flat display device, wherein the flat display device is in a concave recess on one side of the window.

16 Claims, 6 Drawing Sheets

FLAT PANEL DISPLAY

CROSS-REFERENCE TO RELATED APPLICATION

Korean Patent Application No. 10-2013-0033063, filed on Mar. 27, 2013, in the Korean Intellectual Property Office, and entitled: "Flat Panel Display," is incorporated by reference herein in its entirety.

BACKGROUND

1. Field

Embodiments relate to a flat panel display.

2. Description of the Related Art

A variety of portable electronic devices, e.g., mobile phone, PDA, and PMP, may include a display device for displaying an image. As the display device, flat panel displays, e.g., a liquid crystal display (LCD), an organic light emitting diode (OLED), and an electrophoretic display (EPD), which have excellent space efficiency, may be used. A flat panel display mounted on a portable electronic device may have a window to protect a display panel exposed to the outside.

The above information disclosed in this Background section is only for enhancement of understanding of the background of the invention and therefore it may contain information that does not form the prior art that is already known in this country to a person of ordinary skill in the art.

SUMMARY

Embodiments are directed to a flat panel display.

The embodiments may be realized by providing a flat panel display including a flat display device; and a window protecting the flat display device, the window transmitting light emitted from the flat display device, wherein the flat display device is in a concave recess on one side of the window.

Sidewalls of the recess may be inclined.

The sidewalls of the recess may be inclined from an inside toward an outside of the recess.

A circumference of a circumferential edge of the recess may be larger than a circumference of a circumferential edge of the flat display device.

The circumferential edge of the recess may have a rectangular shape.

The circumferential edge of the recess and the circumferential edge of the flat display device adjacent to the recess may be arranged in parallel to each other.

The flat panel display may further include a printed layer at an edge area of the window around the recess and at an edge area of the recess including the sidewalls.

The flat display device may include a flat panel that displays an image; and a polarizing layer on a light emitting surface of the flat panel, and a first resin layer may be between the polarizing layer and an inner wall of the recess.

The flat panel display may further include a second resin layer filled between a side portion of the flat display device and the sidewalls of the recess.

The flat display device may include a flexible panel having a thickness smaller than a depth of the recess, and an optical clear adhesive may be provided between the flexible panel and an inner wall of the recess.

A resin layer may fill in a remaining space of the recess.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
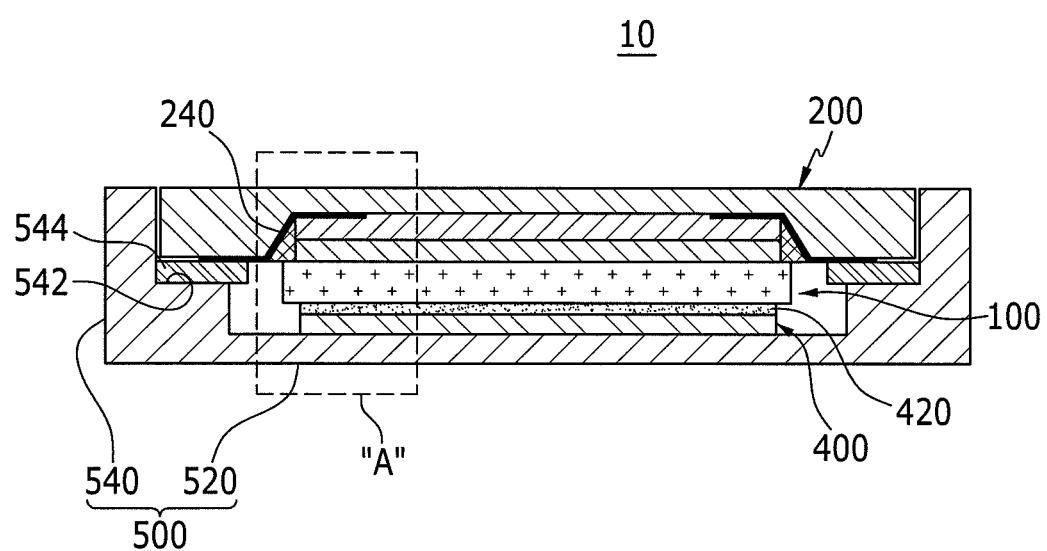
FIG. 1 illustrates a cross-sectional view of a flat panel display according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

With reference to the respective drawings, like reference numerals will be attached to designate like elements. In the accompanying drawings, the dimensions of structures are exaggerated for clarity of the present invention. Terms such as first and second may be used for describing various constituent elements, but the constituent elements are not limited to the terms. The terms are used only to distinguish one constituent element from another constituent element. For example, a first constituent element may be referred to as a second constituent element and the second constituent element may be referred to as the first constituent element, without departing from the scope of the present invention. A singular expression includes a plural expression as long as they are not clearly different from each other in the context.

In the specification, it should be understood that a term such as "include" or "have" designates the existence of feature, figure, step, operation, constituent element, part or combination thereof, but does not exclude the existence or addition of one or more other features, figures, steps, operations, constituent elements, parts or combinations thereof.

It will be understood that when an element such as a layer, film, region, or substrate is referred to as being "on" another element, it can be directly on the other element or intervening elements may also be present. On the other hand, when a portion such as layer, film, area, or plate is referred to as being "under" another portion, it may be directly under the other portion, and another portion may be interposed therebetween. In addition, it will also be understood that when an element is referred to as being "between" two element, it can be the only element between the two elements, or one or more intervening elements may also be present.

Hereinafter, referring to FIGS. 1 to 6, an exemplary embodiment will be described in detail.

Figure 2:
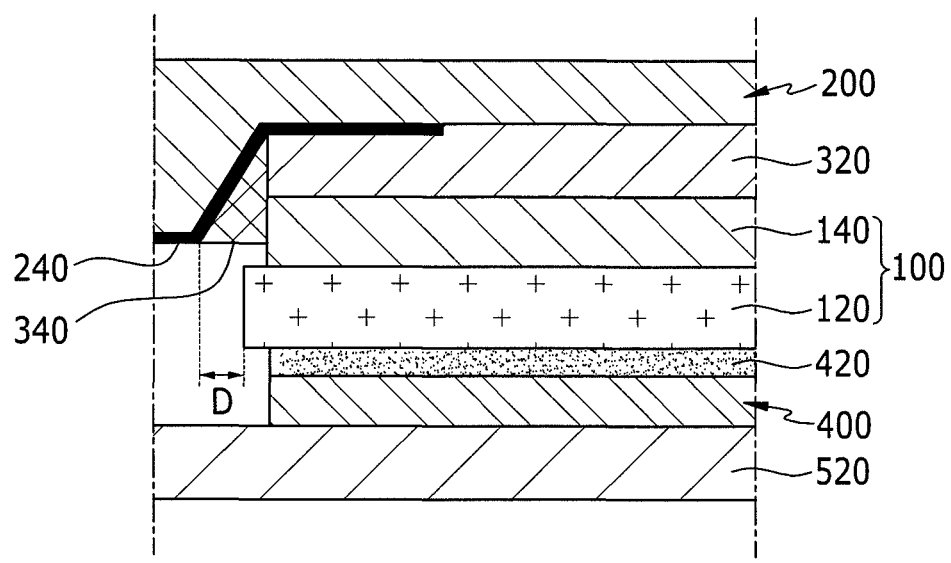
FIG. 2 illustrates an enlarged view of portion "A" of FIG. 1.
Figure 3:
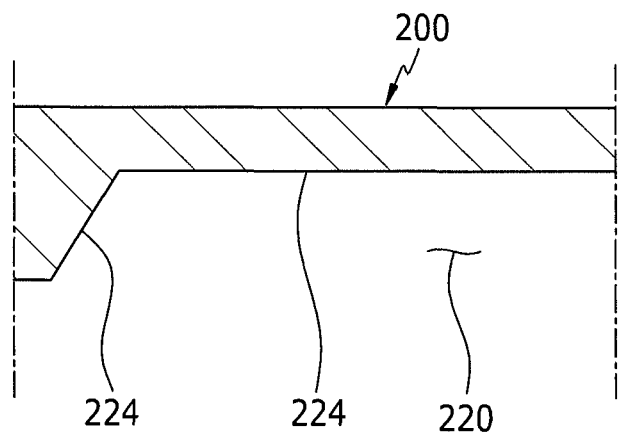
FIG. 3 illustrates a diagram of a window of FIG. 2.

FIG. 1 illustrates a cross-sectional view of a flat panel display according to a first exemplary embodiment. FIG. 2 illustrates an enlarged view of portion "A" of FIG. 1. FIG. 3 illustrates a diagram of a window of FIG. 2.

Referring to FIGS. 1 to 3, the flat panel display 10 according to the first exemplary embodiment may include, e.g., a flat display device 100, a window 200, a buffer member 400, and a support frame 500.

The flat display device 100 may include a flat panel 120 and a polarizing layer 140. The flat panel 120 may display an image. The flat panel 120 may include an OLED panel having a touch screen panel (TSP) provided separately therefrom or an OLED having a touch sensor integrated therein. In an implementation, the flat panel 120 may include an LCD panel.

The polarizing layer 140 may be on a light emitting surface of the flat panel 120, e.g., a top surface of the flat panel 120. The polarizing layer 140 may polarize light emitted from the flat panel 120 so as to help improve the quality of an image displayed on the flat panel 120.

The window 200 may protect the flat display device 100, and may transmit light emitted from the flat display device 100 such that an image displayed on the flat display device 100 may be seen from outside. The window 200 may be formed of, e.g., a plastic material such as acrylic or a glass material, which may have impact resistance.

At a bottom surface or side of the window 200, a recess 220 may be concavely formed. For example, the recess 220 may be a concave recess 220. The recess 220 may have a shape corresponding to an outer shape of the flat display device 100. For example, when the flat display device 100 has a rectangular outer shape, the recess 220 may also have a rectangular outer shape. In an implementation, sidewalls 222 of the recess 220 may be inclined at a predetermined angle, e.g., with respect to the bottom surface of the window 200.

The recess 220 may have a larger size than the outer shape of the flat display device 100. For example, the recess 220 may be formed in such a manner that a circumferential edge of the recess 220 is positioned outside of a circumferential edge of the flat display device 100. For example, a circumference of the circumferential edge of the recess 220 may be greater than a circumference of the circumferential edge of the flat display device 100. Thus, the circumferential edge of the recess 220 and the circumferential edge of the flat display device 100 may be arranged in parallel with each other. As a result, the circumferential edge of the recess 220 may be spaced apart from the circumferential edge of the flat display device 100a by a predetermined distance D in a horizontal direction.

Due to the distance D between the circumferential edge of the recess 220 and the circumferential edge of the flat display device 100, an aligned state or tilted state of the flat display device 100 with respect to the window 200 may be easily checked or observed, as will be described below.

At an edge area of the bottom surface of the window 200 and an edge area of the recess 220 (including the sidewalls 222), a printed layer 240 may be formed. The printed layer 240 may be formed by, e.g., printing a color, or a black printed layer 240 may be formed. The printed layer 240 may block light emitted from the flat display device 100 such that the light is not transmitted to the outside through the edge area of the window 200 and the edge area of the recess 220 (including the sidewalls 222). Thus, internal parts of the flat panel display 10 may not be seen from outside.

In an implementation, the black printed layer 240 may be formed at the edge area of the bottom surface of the window 200 and the edge area of the recess 220 and the sidewalls 222 of the recess 220 may be inclined from the inside toward the outside of the recess. Thus, when ink for forming the black printed layer 240 is sprayed from a bottom of the window 200, the black ink may be easily printed on the edge area of the bottom surface of the window 200 and the edge area of the recess 220 including the sidewalls 222 of the recess 220. If sidewalls of the recess were to be formed vertically with respect to the bottom surface of the window, and ink for forming a black printed layer were to be sprayed from a bottom of the window, the black ink may not be completely applied on the vertical sidewalls of the recess because the sidewalls of the recess would be arranged perpendicularly to a spraying direction of the black ink. However, when the sidewalls 222 are inclined from the inside toward the outside of the recess 220, as in an embodiment, the black ink may be completely applied on the sidewalls 222 of the recess 220.

The flat display device 100 may be inserted into and coupled with the window 200 at the recess 220 in the bottom surface of the window 200. First, a bottom wall 224 of the recess 220 may be provided with a first resin layer 320 that has a predetermined thickness. The first resin layer 320 may be formed of a transparent adhesive material having a high light transmittance. In a state where the first resin layer 320 is provided on the bottom wall 224 of the recess 220, the flat display device 100 may be inserted into the recess 220, and the polarizing layer 140 of the flat display device 100 may be pressed on the first resin layer 320.

In this case, the flat display device 100 may be inserted into the recess 220 of the window 200 by or to a particular distance, e.g., a distance obtained by subtracting a thickness of the first resin layer 320 from a depth of the recess 220. Therefore, compared to another flat panel display in which a flat display device is coupled with one surface of, e.g., an outer surface of, a window, an entire thickness of the flat panel display 10 may be reduced. For example, it is possible to provide a flat panel display 10 that is slimmer than other flat panel displays.

Meanwhile, when the flat display device 100 is inserted in the recess 220 of the window 200 and coupled therewith, an aligned state and/or a tilted or skewed state of the flat display device 100 (with respect to the window 200) may be easily checked or observed through or due to the distance D between the circumferential edge of the recess 220 and the circumferential edge of the flat display device 100.

Figure 4:
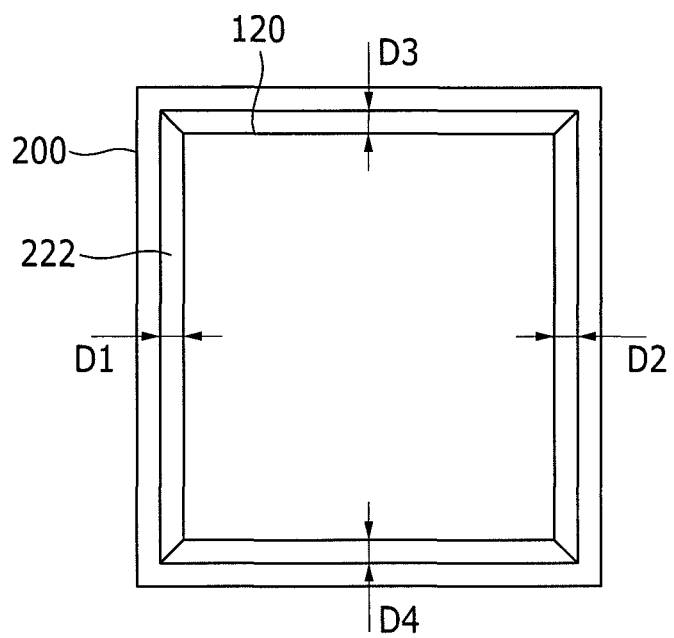
FIG. 4 illustrates a diagram of an aligned state of a flat display device with respect to a window.

For example, as illustrated in FIG. 4, when bottom edges of the sidewalls 222 of the recess 220 (see FIG. 1) and edges of the flat panel 120 are parallel to each other, and distances D1, D2, D3, and D4 therebetween are about equal to each other, it may be checked or observed that the flat display device 100 is normally aligned with the window 200. On the other hand, if most of the distances D1, D2, D3, and D4 are maintained parallel to each other, it may be checked or observed that the flat display device 100 is misaligned with the window 200 if at least one of the distances D1, D2, D3, and D4 is different from the others.

Figure 5:
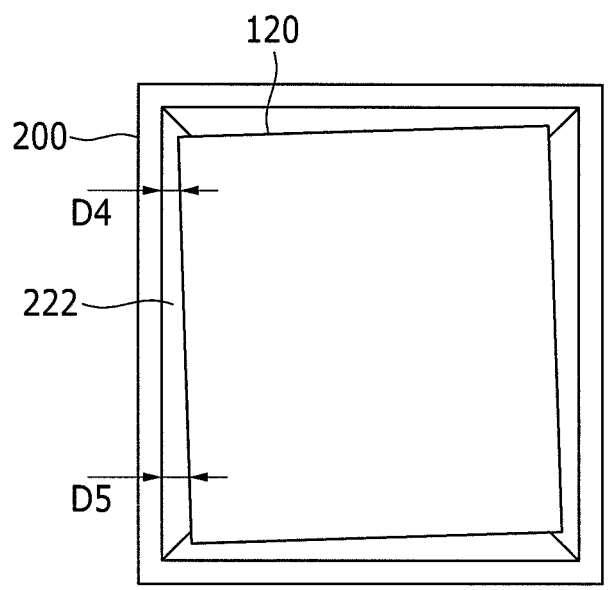
FIG. 5 illustrates a diagram of a tilted state of the flat display device with respect to the window.

Furthermore, as illustrated in FIG. 5, when the bottom edge of one sidewall 222 of the recess 220 (see FIG. 1) and the edge of the flat panel 120 are not parallel to each other, e.g., when distances D4 and D5 therebetween are successively changed along a longitudinal direction, it may be checked or observed that the flat display device 100 is tilted with respect to the window 200.

Referring back to FIGS. 1 to 3, a second resin layer 340 may be formed in a space between the sidewall 222 of the recess 220 and a side portion of the flat display device 100. The second resin layer 340 may reinforce a stiffness or strength of the flat display device 100 inserted in the recess 220 and coupled with the recess window 200. The second resin layer 340 may be formed of a transparent adhesive material having a high light transmittance.

The buffer member 400 may buffer impact transmitted to the flat display device 100 if the impact is applied to the flat display device 100, e.g., by a free fall or the like. The buffer member 400 may be formed of a rubber or synthetic resin having a buffer function, and may be coupled with a bottom surface of the flat panel 120 of the flat display device 100 through, e.g., a double-sided adhesive tape 420, having an adhesive on both sides thereof.

The support frame 500 may support the flat display device 100 and the window 200. The support frame 500 may include a bottom wall 520 and sidewalls 540 that extend vertically from circumferential edges of the bottom wall 520. On inner surfaces of the sidewalls 540 of the support frame 500, stair-shaped step portions 542 may be formed.

The bottom wall 520 of the support frame 500 may support the buffer member 400 that is coupled with the bottom surface of the flat panel 120. The step portions 542 of the sidewalls 540 of the support frame 500 may support the edge area of the bottom surface of the window 200. In an implementation, a double-sided adhesive tape 544 may be interposed between the step portions 542 of the sidewalls 540 of the support frame 500 and the edge area of the bottom surface of the window 200.

Now, a flat panel display 10' according to a second exemplary embodiment will be described.

Figure 6:
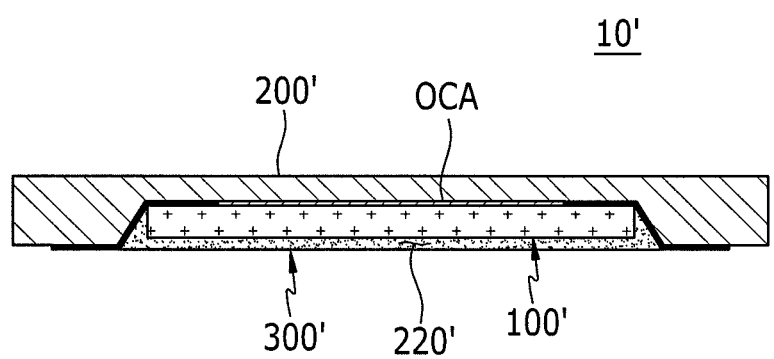
FIG. 6 illustrates a cross-sectional view of a flat panel display according to a second exemplary embodiment.

FIG. 6 illustrates a cross-sectional view of the flat panel display 10' according to the second exemplary embodiment.

Referring to FIG. 6, the flat panel display 10' according to the second exemplary embodiment may include a flat display device 100', a window 200', a resin layer 300', a buffer member (not illustrated), and a support frame (not illustrated).

The window 200' may have the same structure as the window 200 illustrated in FIGS. 1 to 3, and thus repeated descriptions thereof may be omitted herein. Although the buffer member and the support frame are not illustrated in FIG. 6, for better understanding and ease of description, they may have the same structures and functions as the buffer member 400 and the support frame 500 illustrated in FIGS. 1 to 3. Therefore, repeated descriptions thereof may be omitted herein.

The flat display device 100' may include a flexible panel having a thickness smaller than a depth of the recess 220' in the window 200'. The flat display device 100' provided in the form of a flexible panel may be inserted into the recess 220' and coupled with the window 200'.

First, an optical clear adhesive (OCA) having a predetermined thickness may be provided on a bottom or inner wall of the recess 220'. In a state where the OCA is provided on the bottom or inner wall of the recess 220', the flat display device 100' (provided in the form of a flexible panel) may be inserted into the recess 220', and one surface of the flat display device 100' may be pressed on the OCA.

In this case, the flat display device 100' may have a smaller thickness than a depth of the recess 220', and may be completely inserted into the recess 220'. Thus, an entire thickness of the flat panel display 10' may be reduced, in comparison to another flat panel display in which the flat display device is coupled with one surface of, e.g., an outer surface of, the window. For example, it is possible to provide a flat panel display 10' that is slimmer than the other flat panel display.

A space, e.g., an empty space, within the recess 220' of the window 200' in which the flat display device 100' is inserted and coupled with may be filled with a resin layer 300'. For example, the resin layer 300' may be buried in or may fill a space between a side portion of the flat display device 100' and the sidewall of the recess 220' and a space contacted with the other surface of the flat display device 100', e.g., may fill remaining spaces in the recess 220'. The resin layer 300' buried in or filling the space of the recess 220' may help reinforce the stiffness or strength of the flat panel display 10' (provided as a flexible panel). The resin layer 300' may be formed of a transparent adhesive material having a high light transmittance.

The embodiments provide a flat panel display having a small thickness.

The embodiments provide a flat panel display capable of easily checking aligned and tilted states of a flat display device with respect to a window.

The embodiments provide a flat panel display capable of reinforcing the stiffness of a flat display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flat panel display, comprising:
    a flat display device; and
    a window protecting the flat display device, the window:
        including a concave recess in one side thereof, and
        transmitting light emitted from the flat display device,
    wherein the flat display device is in the concave recess in the one side of the window.

2. The flat panel display as claimed in claim 1, wherein sidewalls of the recess are inclined.

3. The flat panel display as claimed in claim 2, wherein the sidewalls of the recess are inclined from an inside toward an outside of the recess.

4. The flat panel display as claimed in claim 3, wherein a circumference of a circumferential edge of the recess is larger than a circumference of a circumferential edge of the flat display device.

5. The flat panel display as claimed in claim 4, wherein the circumferential edge of the recess has a rectangular shape.

6. The flat panel display as claimed in claim 4, wherein the circumferential edge of the recess and the circumferential edge of the flat display device adjacent to the recess are arranged in parallel to each other.

7. The flat panel display as claimed in claim 4, further comprising a printed layer at an edge area of the window around the recess and at an edge area of the recess including the sidewalls.

8. The flat panel display as claimed in claim 4, wherein:
    the flat display device includes:
        a flat panel that displays an image; and
        a polarizing layer on a light emitting surface of the flat panel, and
    a first resin layer is between the polarizing layer and an inner wall of the recess.

9. The flat panel display as claimed in claim 8, further comprising a second resin layer filled between a side portion of the flat display device and the sidewalls of the recess.

10. The flat panel display as claimed in claim 4, wherein:
    the flat display device includes a flexible panel having a thickness smaller than a depth of the recess, and
    an optical clear adhesive is provided between the flexible panel and an inner wall of the recess.

11. The flat panel display as claimed in claim 10, wherein a resin layer fills in a remaining space of the recess.

12. A flat panel display, comprising:
    a flat display device;

a window protecting the flat display device, the window transmitting light emitted from the flat display device; and a printed layer at an edge area of the window around the recess and at an edge area of the recess including sidewalls of the recess, wherein the flat display device is in a concave recess on one side of the window.

13. The flat panel display as claimed in claim 12, wherein:
the flat display device includes:
   a flat panel that displays an image; and
   a polarizing layer on a light emitting surface of the flat panel, and
a first resin layer is between the polarizing layer and an inner wall of the recess.

14. The flat panel display as claimed in claim 13, further comprising a second resin layer filled between a side portion of the flat display device and the sidewalls of the recess.

15. The flat panel display as claimed in claim 12, wherein:
the flat display device includes a flexible panel having a thickness smaller than a depth of the recess, and
an optical clear adhesive is provided between the flexible panel and an inner wall of the recess.

16. The flat panel display as claimed in claim 15, wherein a resin layer fills in a remaining space of the recess.

* * * * *